United States Patent
Irizumi

(10) Patent No.: US 7,923,725 B2
(45) Date of Patent: Apr. 12, 2011

(54) SEMICONDUCTOR DEVICE AND A METHOD OF MANUFACTURING THE SAME

(75) Inventor: Tomoyuki Irizumi, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 12/470,080

(22) Filed: May 21, 2009

(65) Prior Publication Data

US 2009/0294769 A1  Dec. 3, 2009

(30) Foreign Application Priority Data

May 28, 2008  (JP) ................... 2008-139409

(51) Int. Cl.
*H01L 29/04* (2006.01)
(52) U.S. Cl. ............... 257/57; 257/59; 257/72; 438/153
(58) Field of Classification Search ............. 257/57, 257/59, 72, 347, E29.291, E21.134; 438/153
See application file for complete search history.

(56) References Cited

U.S. PATENT DOCUMENTS

2009/0140250 A1  6/2009  Yamazaki et al.
2009/0166631 A1 *  7/2009  Yamazaki ............... 257/57

FOREIGN PATENT DOCUMENTS

| JP | 5-55570 | 3/1993 |
|---|---|---|
| JP | 5-190857 | 7/1993 |
| JP | 2005-167051 | 6/2005 |
| JP | 2007-5508 | 1/2007 |
| JP | 2007-35964 | 2/2007 |
| JP | 2009-177138 | 8/2009 |

* cited by examiner

*Primary Examiner* — Theresa T Doan
(74) *Attorney, Agent, or Firm* — Oblon, Spivak, McClelland, Maier & Neustadt, L.L.P.

(57) ABSTRACT

According to a method of manufacturing a semiconductor device of the present invention, a gate electrode is formed above a substrate, and a insulating film is formed above the gate electrode. Then, an amorphous semiconductor film is formed above the insulating film, laser annealing is performed on the amorphous semiconductor film, and the amorphous semiconductor film is changed to a crystalline semiconductor film. After that, hydrofluoric acid processing is performed on the crystalline semiconductor film, and an amorphous semiconductor film is formed above the crystalline semiconductor film where the hydrofluoric acid processing is performed so that pattern ends of the amorphous semiconductor film are arranged outside pattern ends of the crystalline semiconductor film and the amorphous semiconductor film contacts with the insulating film near the pattern ends.

3 Claims, 7 Drawing Sheets

RELATED ART

SEMICONDUCTOR DEVICE AND A METHOD OF MANUFACTURING THE SAME

BACKGROUND OF THE INVENTION

1. Field of the Invention

The present invention relates to a semiconductor device, and a method of manufacturing the same.

2. Description of Related Art

A liquid crystal display device (LCD), which is one of thin type panels, has been broadly used as a monitor for a personal computer, that for a portable information terminal device, that for an in-vehicle monitor such as a car navigation system, and the like, while taking advantage of low power consumption, small size, and lightweight. Furthermore, in recent years, the liquid crystal display device has been widely used in a TV set, and will replace a conventional cathode-ray tube. Further, an organic EL (Electro-Luminescence) display device, which overcomes the problems of an LCD such as restrictions of view angle and contrast and difficulty of following ability of high-speed response to a motion picture, has been employed as a next-generation thin panel device. The organic EL display device has features which an LCD does not have, such as self-luminous type, wide view angle, high contrast, and high-speed response.

Thin film transistors (hereinafter referred to as TFT) used for such a display device often has a MOS structure using a semiconductor film. As TFTs, there are several kinds including the inverse staggered type (bottom-gate type) and the top-gate type. Further, semiconductor films often include an amorphous silicon (a-Si) film, which is an amorphous semiconductor film.

In the TFT that uses the a-Si film as the semiconductor film, trapping and injection of electrons from the a-Si film to the gate insulating film and the localized level density in the a-Si film increase. Thus, such a TFT has a drawback in that the shift of the threshold voltage occurs. In order to compensate for this drawback, the circuit design is made in consideration of the shift amount of the threshold voltage in advance. However, the TFT using the a-Si film can only be used as a TFT for switching a pixel portion, and cannot be used in a gate driver circuit or the like. In order to deal with this, a gate driver IC is externally provided in the display device for gate driver. Accordingly, the frame of the display device inevitably increases.

In order to solve the above problem, the gate driver circuit also needs to be manufactured by the TFT as well. Thus, crystalline semiconductor films such as a microcrystalline semiconductor film, a polycrystalline semiconductor film and the like are used as the semiconductor film. The crystalline semiconductor film has smaller defect level density compared with the amorphous semiconductor film. Accordingly, the TFT that uses the crystalline semiconductor film does not cause the shift of the threshold voltage, or causes only a small amount of shift, if any. In recent years, especially, a semiconductor film of a stacked layer structure has been proposed that forms the microcrystalline semiconductor film in the semiconductor film that contacts with a gate insulating film, and the amorphous semiconductor film on the microcrystalline semiconductor film.

As a method of forming the microcrystalline semiconductor film, a deposition method by a plasma CVD (Chemical Vapor Deposition) method has been known (see for example, Japanese Unexamined Patent Application Publication No. 2005-167051). Further, a method has been known in which an amorphous semiconductor film is first formed, and thereafter the amorphous semiconductor film is irradiated with a laser beam, so as to microcrystallize the semiconductor film (see for example, Japanese Unexamined Patent Application Publication Nos. 2005-167051, 2007-5508, and 2007-35964).

However, in the microcrystalline semiconductor film that is formed by the deposition method by the plasma CVD method, an incubation layer is formed in an initial stage of forming a film. In summary, the amorphous semiconductor film before starting the crystal growth is formed in an initial stage of forming a film. Thus, the semiconductor film that contacts with the gate insulating film is an amorphous semiconductor film. As such, trapping and injection of the electrons from the amorphous semiconductor film to the gate insulating film and the localized level density in the amorphous semiconductor film are increased. Then, the shift of the threshold voltage occurs. Further, according to the method in which an amorphous semiconductor film is first formed, and thereafter the amorphous semiconductor film is irradiated with a laser beam, so as to microcrystallize the semiconductor film, the semiconductor film that contacts with the gate insulating film is a microcrystalline semiconductor film. The microcrystalline semiconductor film has a small defect level density. Thus, the TFT using the microcrystalline semiconductor film that is formed according to the method above does not cause the shift of the threshold voltage, or only causes small amount of shift, if any.

However, according to the method in which an amorphous semiconductor film is first formed, and thereafter the amorphous semiconductor film is irradiated with a laser beam, so as to microcrystallize the semiconductor film, a native oxide film is formed on the surface of the microcrystalline semiconductor film that is formed. Further, as the microcrystalline semiconductor film is exposed to an atmosphere, the microcrystalline semiconductor film is contaminated. If the amorphous semiconductor film is formed on the microcrystalline semiconductor film to manufacture the TFT with this state, the initial characteristics degrade. More specifically, the on current decreases and the off current increases. Then, in order to remove the native oxide film on the surface of the microcrystalline semiconductor film and to clean the surface of the microcrystalline semiconductor film, the hydrofluoric acid processing is performed after forming the microcrystalline semiconductor film. If the amorphous semiconductor film is formed after that, the initial characteristics are improved.

Furthermore, a method of separating the use of the TFT using the amorphous semiconductor film and the TFT using the polycrystalline semiconductor film as the semiconductor film according to the roles of TFTs has also been proposed (see for example, Japanese Unexamined Patent Application Publication No. 5-55570). However, according to this method, the shift of the threshold voltage occurs with the TFT using the amorphous semiconductor film.

Furthermore, a method of providing a low resistance semiconductor film or a metallic film between the gate insulating film and the amorphous semiconductor film which is the semiconductor film has also been proposed (see for example, Japanese Unexamined Patent Application Publication No. 5-190857). However, the low resistance semiconductor film or the metallic film only functions as the low resistance element, and does not function as a TFT channel with this structure. In summary, it is the amorphous semiconductor film that functions as a channel, and thus, the shift of the threshold voltage occurs.

Now, with reference to FIG. 7, a manufacturing method of a semiconductor device with a microcrystalline silicon TFT according to a related art will be described. FIG. 7 is a cross sectional view showing the structure of the semiconductor device with the microcrystalline silicon TFT according to the related art.

First, a metallic film is formed on a glass substrate 200 by sputtering. An alloy material or a metal material such as Al, Cr, Mo, Ti, W or the like may be used as the metallic film. Then, a resist pattern is formed on the metallic film by photolithography. After that, the metallic film is patterned into a desired shape with an etchant. Then, the resist is removed. A gate electrode 201 is thus formed.

Next, a gate insulating film 202 is formed by a CVD method. Then, an a-Si film which is an amorphous semiconductor film is formed by the CVD method. Next, the concentration of hydrogen in the a-Si film is decreased by an annealing process. Then, the a-Si film is crystallized by laser annealing, so as to form a microcrystalline silicon film 203 which is the microcrystalline semiconductor film. Next, hydrofluoric acid processing is performed to remove the oxide film formed on the surface of the microcrystalline silicon film 203 and to clean the surface of the microcrystalline silicon film 203. Then, an a-Si film 204 which is the amorphous semiconductor film and an n-type amorphous silicon (n-a-Si) film 205 which is the n-type amorphous semiconductor film are formed by the CVD method.

Next, a resist pattern is formed on the n-a-Si film 205 by photolithography. After that, the n-a-Si film 205, the a-Si film 204, and the microcrystalline silicon film 203 are collectively patterned into a desired shape with the etchant. Then, the resist is removed.

Next, a metallic film is formed on the n-a-Si film 205 by sputtering. An alloy material or a metal material such as Al, Cr, Mo, Ti, W or the like can be used as the metallic film. Then, a resist pattern is formed on the metallic film by photolithography. After that, the metallic film is patterned into a desired shape with an etchant. Thus, a source electrode 207 and a drain electrode 208 are formed.

Next, the whole n-a-Si film 205 and a part of the a-Si film 204 corresponding to the channel region are removed by etching while leaving the resist on the metallic film. A back channel etch portion 206 is thus formed. Next, an SiN film 209 which is a protective film is formed by the CVD method. Then, the resist pattern is formed on the SiN film 209 by photolithography. After that, the SiN film 209 is patterned into a desired shape by etching, so as to remove the resist. As such, a contact hole 210 that reaches the drain electrode 208 is opened.

Next, an ITO film, which is a transparent conductive film, is formed by sputtering. Then, the resist pattern is formed on the ITO film by photolithography. After that, the ITO film is patterned into a desired shape with the etchant. Then, the resist is removed. A pixel electrode 211 is thus formed. According to the above process, the semiconductor device having a microcrystalline silicon TFT structure is completed.

However, when the amorphous semiconductor film is formed on the surface of the microcrystalline semiconductor film after the hydrofluoric acid processing is performed as described above, a film floating or a film peeling occurs between the microcrystalline semiconductor film and the amorphous semiconductor film due to the film stress of the amorphous semiconductor film or poor adhesion of the microcrystalline semiconductor film with the amorphous semiconductor film. The condition in which the film floating or the film peeling occurs is not always the same, but it varies depending on the situations. Some TFTs have good initial characteristics, which others have poor initial characteristics. This decreases the yield rate, and accordingly, decreases the production efficiency as well.

SUMMARY OF THE INVENTION

The present invention has been made to overcome the above-described problem, and aims to provide a semiconductor device and a method of manufacturing the same with improved characteristics.

According to one aspect of the present invention, there is provided a method of manufacturing a semiconductor device, the method including forming a gate electrode above a substrate, forming an insulating film above the gate electrode, forming an amorphous semiconductor film above the insulating film, performing laser annealing on the amorphous semiconductor film to change the amorphous semiconductor film into a crystalline semiconductor film, performing hydrofluoric acid processing on the crystalline semiconductor film, and forming an amorphous semiconductor film above the crystalline semiconductor film where the hydrofluoric acid processing is performed so that pattern ends of the amorphous semiconductor film are arranged outside pattern ends of the crystalline semiconductor film and the amorphous semiconductor film contacts with the insulating film near the pattern ends.

According to another aspect of the present invention, there is provided a semiconductor device, including a gate electrode, an insulating film that is formed above the gate electrode, a crystalline semiconductor film that is formed above the insulating film, and an amorphous semiconductor film formed above the crystalline semiconductor film so that pattern ends of the amorphous semiconductor film are arranged outside pattern ends of the crystalline semiconductor film and the amorphous semiconductor film contacts with the insulating film near the pattern ends.

According to the present invention, it is possible to provide a semiconductor device and a method of manufacturing the same with improved characteristics.

The above and other objects, features and advantages of the present invention will become more fully understood from the detailed description given hereinbelow and the accompanying drawings which are given by way of illustration only, and thus are not to be considered as limiting the present invention.

DESCRIPTION OF THE PREFERRED EMBODIMENTS

First Embodiment

Figure 1:
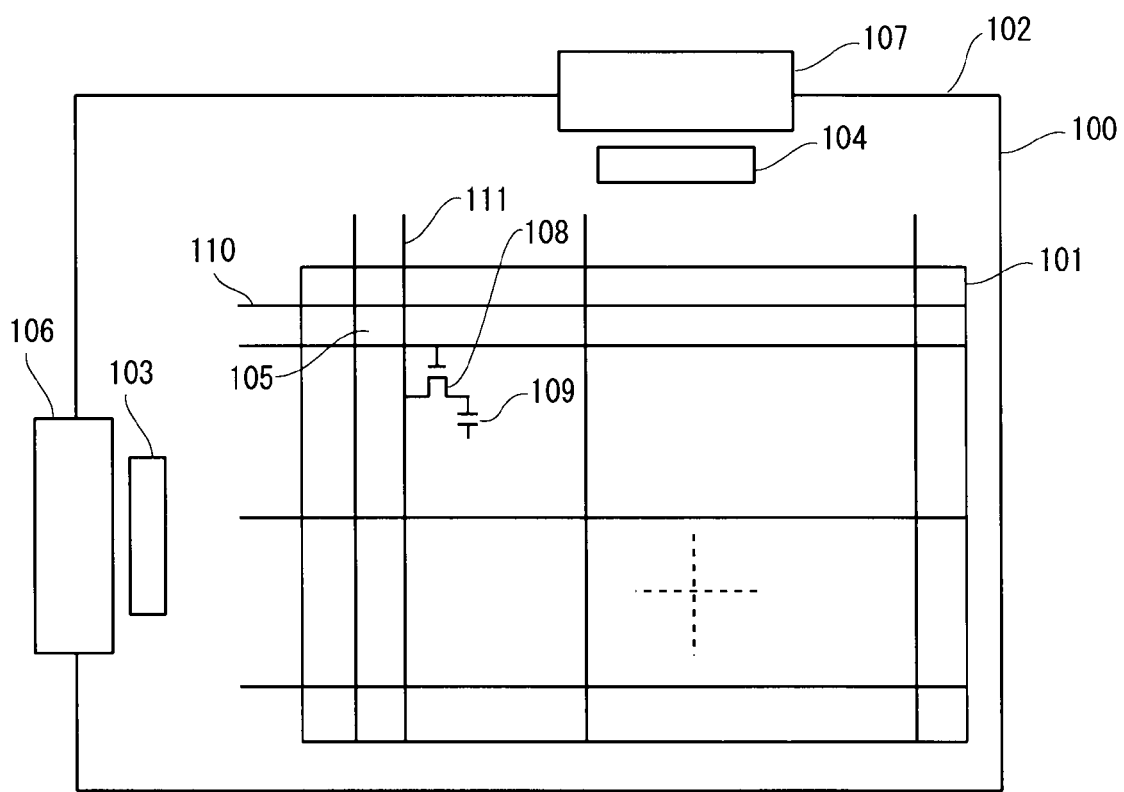
FIG. 1 is a plane view showing the structure of a TFT substrate used for a display device according to a first embodiment.

Referring first to FIG. 1, a TFT substrate including a semiconductor device according to the first embodiment will be described. FIG. 1 is a plane view showing the structure of a TFT substrate. The TFT substrate can be used for a flat-type display device (flat panel display) such as a liquid crystal display device and an organic EL display device.

A TFT substrate 100 is, for example, a TFT array substrate where thin film transistors (hereinafter referred to as TFT) 108 are arranged in array. The TFT substrate 100 has a display region 101 and a frame region 102 surrounding the display region 101. In the display region 101, a plurality of gate lines (scanning signal lines) 110, a plurality of storage capacitance lines (not shown), and a plurality of source lines (display signal lines) 111 are formed. The plurality of gate lines 110 and the plurality of storage capacitance lines are arranged in parallel. Each of the storage capacitance lines is arranged between adjacent gate lines 110. In short, the gate lines 110 and the storage capacitance lines are alternately arranged. The plurality of source lines 111 are arranged in parallel. The gate lines 110 and the source lines 111 cross each other. Likewise, the storage capacitance lines and the source lines 111 cross each other. The gate lines 110 and the source lines 111 are orthogonal to each other. Likewise, the storage capacitance lines and the source lines 111 are orthogonal to each other. Then, a region surrounded by the adjacent gate line 110 and the storage capacitance line, and the adjacent source lines 111 is a pixel 105. The pixels 105 are arranged in matrix in the TFT substrate 100.

Further, the frame region 102 of the TFT substrate 100 includes a scanning signal driving circuit 103 and a display signal driving circuit 104. The gate line 110 extends from the display region 101 to the frame region 102. Then, the gate line 110 is connected with the scanning signal driving circuit 103 at the end of the TFT substrate 100. The source line 111 similarly extends from the display region 101 to the frame region 102. Then, the source line 111 is connected to the display signal driving circuit 104 at the end of the TFT substrate 100. An external line 106 is connected near the scanning signal driving circuit 103. Further, an external line 107 is connected near the display signal driving circuit 104. The external lines 106 and 107 are constituted, for example, by a wiring board such as FPC (Flexible Printed Circuit).

Various signals are externally supplied to the scanning signal driving circuit 103 and the display signal driving circuit 104 through the external lines 106 and 107. The scanning signal driving circuit 103 supplies a gate signal (scanning signal) to the gate lines 110 in accordance with an external control signal. The gate lines 110 are successively selected in accordance with the gate signal. The display signal driving circuit 104 supplies a display signal to the source lines 111 in accordance with the external control signal or display data. As a result, the display voltage corresponding to the display data can be applied to each pixel 105. Incidentally, the scanning signal driving circuit 103 and the display signal driving circuit 104 are not limited to the above structure where the circuits are formed on the TFT substrate 100. For example, driving circuits maybe connected by a TCP (Tape Carrier Package).

In each pixel 105, at least one TFT 108 and a storage capacity 109 connected to the TFT 108 are formed. The TFT 108 is arranged in the vicinity of an intersection of the source line 111 with the gate line 110. For example, this TFT 108 is a switching element to supply a display voltage to a pixel electrode. The gate electrode of the TFT 108 is connected to the gate line 110, and the TFT 108 is turned ON/OFF under control in accordance with a gate signal input from a gate terminal. The source electrode of the TFT 108 is connected to the source line 111. When a voltage is applied to the gate electrode and the TFT 108 is turned on, a current flows from the source line 111. Thus, a display voltage is applied from the source line 111 to the pixel electrode connected to the drain electrode of the TFT 108. Then, an electric field corresponding to the display voltage is generated between the pixel electrode and an opposing electrode.

On the other hand, the storage capacity 109 is electrically connected not only to the TFT 108 but also to the opposing electrode through the storage capacitance line. Accordingly, the storage capacity 109 is connected in parallel with the capacity between the pixel electrode and the opposing electrode. The storage capacity 109 is structured by forming a dielectric insulating film between the electrodes that are oppositely arranged. Then, the voltage applied to the pixel electrode can be held for a certain period of time by the storage capacity 109. An orientation film (not shown) is formed on the surface of the TFT substrate 100. The TFT substrate 100 is thus formed.

Further, in the liquid crystal display device, an opposing substrate is arranged opposite to the TFT substrate 100. The opposing substrate is, for example, a color filter substrate and is placed on the display screen side. On the opposing substrate, a color filter, a black matrix (BM), the opposing electrode, an orientation film and the like are formed. Incidentally, the opposing electrode is placed on the TFT substrate 100 side, for example, in an IPS-type liquid crystal display device. Then, a liquid crystal layer is formed between the TFT substrate 100 and the opposing substrate. That is, a liquid crystal is filled in between the TFT substrate 100 and the opposing substrate. Further, a polarizing plate, a retardation plate and the like are placed on the outer surfaces of the TFT substrate 100 and the opposing substrate. Further, a backlight unit or the like is arranged on the opposite side to the display screen of the liquid crystal display panel.

A liquid crystal is driven by an electric field generated between the pixel electrode and the opposing electrode. That is, an orientation direction of the liquid crystal between the substrates is changed. As a result, a polarized state of light transmitted through the liquid crystal layer is changed. That is, a polarized state of the light that was turned into linearly-polarized light through the polarizing plate is changed by the liquid crystal layer. More specifically, light from a backlight unit and external light are turned into linearly-polarized light by the polarizing plate in the TFT substrate 100 side. Then, a polarized state is changed by the linearly-polarized light passing through the liquid crystal layer.

Accordingly, an amount of light transmitted through the polarizing plate on the opposing substrate side is changed in accordance with the polarized state. That is, an amount of light transmitted through the polarizing plate on the display screen side out of the light emitted from the backlight unit and transmitted through the liquid crystal display panel is changed. The orientation direction of liquid crystal is changed in accordance with the applied display voltage. Hence, the display voltage is controlled to thereby change an amount of light transmitted through the polarizing plate on the display screen side. That is, different display voltages are applied to the pixels to thereby display a desired image. Further, the smaller the area of the element formed on the TFT substrate 100 is, the larger the amount of the light from the backlight unit that can be transmitted is. As such, the luminance can be made high, and the amount of light of the backlight unit can be reduced, which decreases power consumption. From the above operations, the electric field is formed in the storage capacity 109 in parallel with the electric field between the pixel electrode and the opposing electrode, which contributes to the storage of the display voltage.

Figure 2:
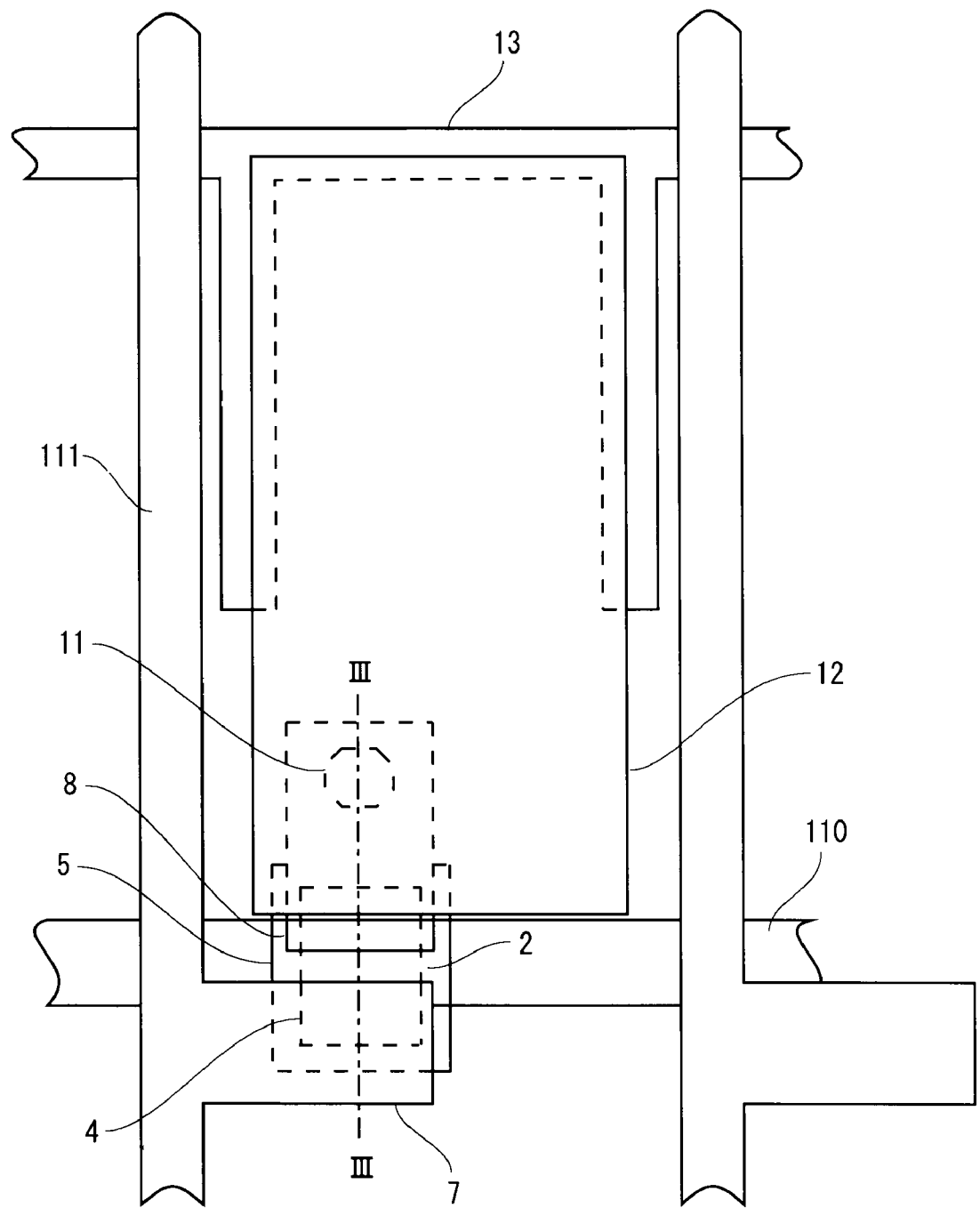
FIG. 2 is a plane view showing the structure of a pixel of a semiconductor device according to the first embodiment.
Figure 3:
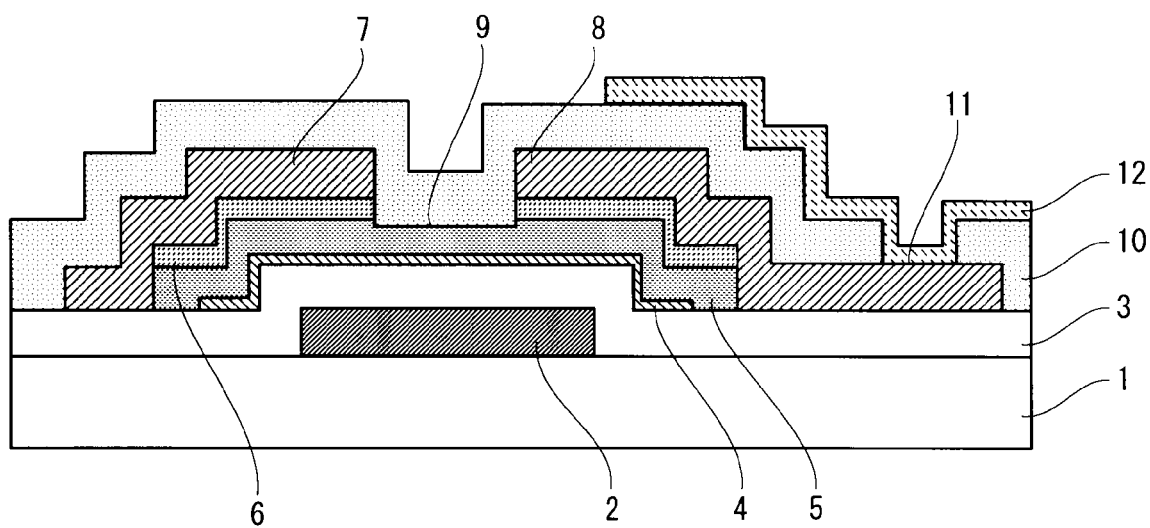
FIG. 3 shows a cross sectional view taken along the line III-III of FIG. 2.

Next, with reference to FIGS. 2 and 3, the semiconductor device using the TFT will be described. FIG. 2 is a plane view showing the structure of the pixel of the semiconductor device. In short, FIG. 2 shows the structure of one pixel of the TFT substrate 100 described above. FIG. 3 shows a cross sectional view taken along the line III-III of FIG. 2. In this example, the structure of a microcrystalline silicon TFT will be described.

In the semiconductor device, the gate line 110, the source lines 111, and the storage capacitance line 13 are formed to define each pixel. In FIG. 2, the gate line 110 is formed in a lateral direction, and the source line 111 is formed in a longitudinal direction. Further, the storage capacitance line 13 is formed in parallel with the gate line 110. Further, a part of the storage capacitance line 13 extends along the source line 111. A rectangular region surrounded by the gate line 110, the storage capacitance line 13, and two source lines 111 is a pixel.

As shown in FIG. 3, a gate electrode 2 is formed on a transparent insulating substrate 1 made of glass or the like. The gate line 110 includes the gate electrode 2. Then, a gate insulating film 3 is formed to cover the gate line 110 and the gate electrode 2. A microcrystalline semiconductor film 4 is formed as a crystalline semiconductor film on the gate insulating film 3. The gate electrode 2 and the microcrystalline semiconductor film 4 are oppositely arranged with the gate insulating film 3 interposed therebetween. The width of the microcrystalline semiconductor film 4 is larger than the width of the gate electrode 2. In summary, the microcrystalline semiconductor film 4 is formed to protrude from the gate electrode 2.

An amorphous semiconductor film 5 is formed on the microcrystalline semiconductor film 4. The microcrystalline semiconductor film 4 and the amorphous semiconductor film 5 are directly connected. The amorphous semiconductor film 5 is formed to be larger than the microcrystalline semiconductor film 4. The pattern ends of the amorphous semiconductor film 5 are arranged outside the pattern ends of the microcrystalline semiconductor film 4. The amorphous semiconductor film 5 is formed to completely cover the microcrystalline semiconductor film 4. In short, the whole outer periphery of the microcrystalline semiconductor film 4 is formed so as not to protrude from the amorphous semiconductor film 5. In other words, the microcrystalline semiconductor film 4 is formed inside the pattern of the amorphous semiconductor film 5. The amorphous semiconductor film 5 and the gate insulating film 3 are formed to have the microcrystalline semiconductor film 4 therebetween, and the outer periphery portion of the amorphous semiconductor film 5 adheres to the gate insulating film 3. In summary, the amorphous semiconductor film 5 and the gate insulating film 3 are directly connected near the pattern ends of the amorphous semiconductor film 5. In other words, the amorphous semiconductor film 5 and the gate insulating film 3 are directly connected near the outside of the outer periphery of the microcrystalline semiconductor film 4.

An n-type amorphous semiconductor film 6 is formed on the amorphous semiconductor film 5. The amorphous semiconductor film 5 and the n-type amorphous semiconductor film 6 are directly connected. The impurity elements are introduced into the n-type amorphous semiconductor film 6, which will have conductivity. The n-type amorphous semiconductor film 6 is not formed in the center above the gate electrode 2. The part where the n-type amorphous semiconductor film 6 is not formed is a back channel etch portion 9. The n-type amorphous semiconductor film 6 is formed in both ends of the amorphous semiconductor film 5. The n-type amorphous semiconductor film 6 in the storage capacitance line 13 side forms a drain region, and the n-type amorphous semiconductor film 6 which is in the opposite side of the storage capacitance line 13 forms a source region. The source/drain regions each has a lower resistance value than that of the channel region. The channel region here means the region where a channel is formed when the gate voltage is applied to the gate electrode 2. The channel region is formed below the back channel etch portion 9. Thus, when the gate voltage is applied to the gate electrode 2, the channel is formed in an interface with the gate insulating film 3 of the channel region. Then, when the gate voltage is applied in a state where a predetermined voltage is applied between the source region and the drain region, the drain current in accordance with the gate voltage flows between the source region and the drain region.

A source electrode 7 and a drain electrode 8 are formed on the n-type amorphous semiconductor film 6. The source electrode 7 is formed on the source region. Then, the drain electrode 8 is formed on the drain region. The drain electrode 8 is formed to protrude from a region above the gate electrode 2 toward the storage capacitance line 13 side. A protective film 10 is formed on the source electrode 7 and the drain electrode 8 to cover them. A contact hole 11 is formed in the protective film 10 on the drain electrode 8. A pixel electrode 12 is formed on the protective film 10. The pixel electrode 12 is formed in substantially the whole part of the pixel. The pixel electrode 12 is buried in the contact hole 11. As such, the pixel electrode 12 and the drain electrode 8 are connected together. The semiconductor device is thus formed.

In the semiconductor device according to the first embodiment, the amorphous semiconductor film 5 adheres to the gate insulating film 3 so as to surround the outer periphery of the microcrystalline semiconductor film 4. The amorphous semiconductor film 5 and the gate insulating film 3 have excellent adhesion. As such, the adhesion of the microcrystalline semiconductor film 4 with the amorphous semiconductor film 5 is improved, whereby the film floating or the film peeling can be suppressed. Further, the microcrystalline semiconductor film 4 is formed inside the pattern of the amorphous semiconductor film 5. In summary, the microcrystalline semiconductor film 4 is not formed in the lower layer of the outer periphery portion of the amorphous semiconductor film 5. As such, the height of the step portion of the amorphous semiconductor film 5 and the n-type amorphous semiconductor film 6 is lowered, whereby it is possible to suppress the step cutting of the source electrode 7 and the drain electrode 8 that are formed thereon. As such, as the film floating, the film peeling, and the step cutting hardly occur, the semiconductor device having TFT characteristics of high performance and with high reliability can be obtained.

Further, the microcrystalline semiconductor film 4 is used as the channel region. Thus, the defect level density is small, and there is almost no shift of the threshold voltage of the TFT. Further, it is possible to substantially uniform the size and the number of crystal grains in the channel. Thus, the variations of the TFT characteristics can be reduced. As described above, according to the first embodiment, the semiconductor device having excellent characteristics can be obtained. Accordingly, the display device using the semiconductor device also has excellent display characteristics and so on.

Now, with reference to FIGS. 4A to 4H, the manufacturing method of the semiconductor device will be described. FIGS. 4A to 4H are cross sectional views showing the manufacturing method of the semiconductor device.

First, a metallic film is formed on the insulating substrate 1 having optical transparency such as a glass substrate or a quartz substrate by sputtering. In the first embodiment, a glass substrate is used as the insulating substrate 1. Further, an alloy material or a metal material such as Al, Cr, Mo, Ti, W or the like can be used as the metallic film. In the first embodiment, Cr is used as the metallic film. Then, a Cr film is formed to have a film thickness of about 400 nm.

Then, a known photolithography process of applying a resist (photoresist) which is a photosensitive resin on the metallic film by spincoating, and exposing and developing the applied resist is carried out. Thus, the resist is patterned into a desired shape. After that, the metallic film is etched using the resist pattern as a mask, so as to pattern it into a desired shape. Then, the resist is removed. The gate electrode 2 is thus formed. Note that the end surface of the gate electrode 2 is preferably formed to have a tapered shape, whereby the covering property of the gate insulating film 3 that will be formed later is improved. Thus, the insulation breakdown voltage is improved.

Next, the gate insulating film 3 is formed by a CVD method on the gate electrode 2 that is formed. In the first embodiment, a silicon nitride film (SiN film) is used as the gate insulating film 3. Then, the SiN film is formed to have a film thickness of 400 to 600 nm. Although a single layer of SiN film is used as the gate insulating film 3 in the first embodiment, it is not limited to this example. A single layer of silicon oxide film (SiO film) or a lamination layer of SiO film/SiN film may also be used, for example, as the gate insulating film 3. Further, the film thickness of the gate insulating film 3 is not limited to the above film thickness, but may be determined in consideration of the insulation breakdown voltage or the insulation capacity.

After that, the amorphous semiconductor film 14 is formed on the gate insulating film 3 by the CVD method. In the first embodiment, the amorphous silicon (a-Si) film is used as the amorphous semiconductor film 14. Then, the a-Si film is formed to have a film thickness of 30 to 100 nm, preferably 60 to 80 nm. Preferably, the gate insulating film 3 and the amorphous semiconductor film 14 are successively formed in the same device or the same chamber. Thus, contaminants existing in the air atmosphere such as boron can be prevented from being captured in the interfaces of the films.

Further, the amorphous semiconductor film 14 formed by the plasma CVD method includes a large volume of hydrogen therein. As such, it is preferable to anneal the amorphous semiconductor film 14 at a high temperature after forming it in order to reduce the hydrogen. In the first embodiment, the interior of a chamber which is maintained to a low vacuum state in a nitrogen atmosphere is heated to around 480° C., and the substrate on which the amorphous semiconductor film 14 is formed is held for 45 minutes in it. According to this process, radical desorption of the hydrogen does not occur even when the temperature is raised in crystallizing the amorphous semiconductor film 14. Then, surface roughness of the amorphous semiconductor film 14 can be suppressed. From the above process, the structure shown in FIG. 4A can be obtained.

Next, a native oxide film formed on the surface of the amorphous semiconductor film 14 is etched away by the hydrofluoric acid. Then, an inactive gas such as nitrogen is sprayed on the amorphous semiconductor film 14, so as to reduce the oxygen concentration on the surface of the amorphous semiconductor film 14. In this state, the amorphous semiconductor film 14 is irradiated with the laser beam from the upper side. In short, the laser annealing is performed on the amorphous semiconductor film 14. The laser beam passes through a predetermined optical system to be converted to a linear beam, and then irradiates the amorphous semiconductor film 14. Then, by scanning the laser beam on the amorphous semiconductor film 14, the amorphous semiconductor film 14 is melted to change the amorphous semiconductor film 14 into the microcrystalline semiconductor film 4. In the first embodiment, a second higher harmonic wave (oscillation wavelength: 532 nm) of a YAG laser is used as the laser beam. Alternatively, an excimer laser may be used instead of the second higher harmonic wave of the YAG laser. By irradiating the amorphous semiconductor film 14 with the laser beam while blowing nitrogen, the height of bulges which are produced in the crystal grain boundary can be suppressed. In the first embodiment, the average roughness of the crystal surface is reduced to 3 nm or less. From the above process, the amorphous semiconductor film 14 is crystallized to form the microcrystalline semiconductor film 4, and the structure shown in FIG. 4B can be obtained.

Figure 4A:
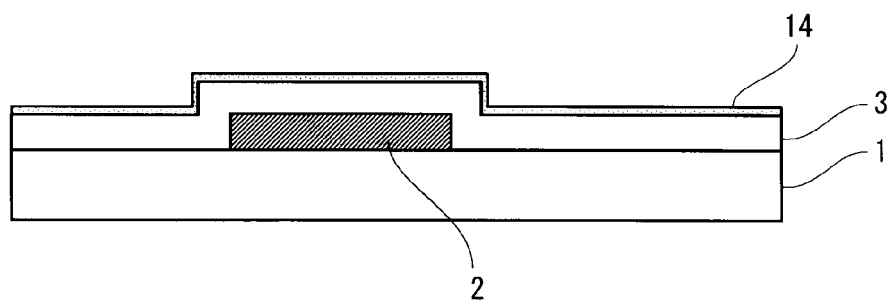
FIGS. 4A to 4H are cross sectional views showing a manufacturing method of the semiconductor device according to the first embodiment.
Figure 4B:
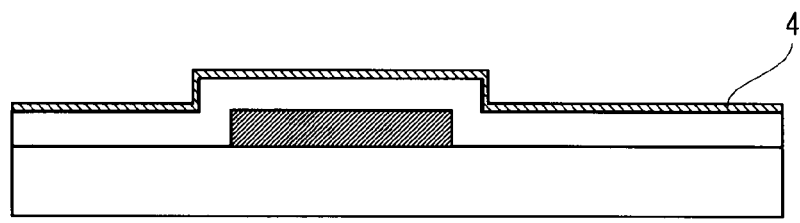
Figure 4C:
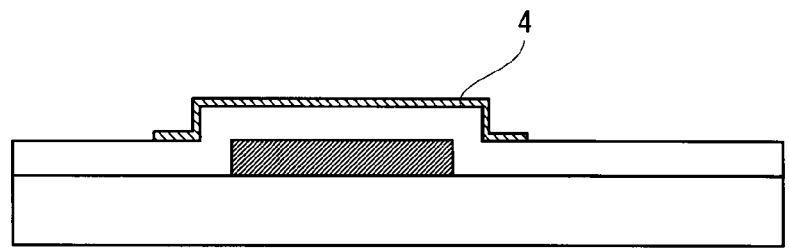
Figure 4D:
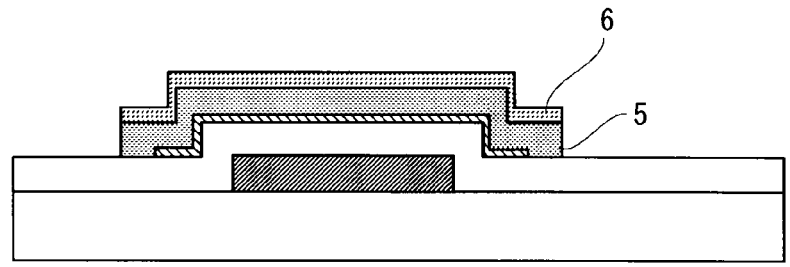

Next, the microcrystalline semiconductor film 4 is patterned into a desired shape with the known photolithography and the dry etching. Then, the resist is removed. Thus, the microcrystalline semiconductor film 4 is processed to have an island shape. Further, the width of the microcrystalline semiconductor film 4 is larger than the width of the gate electrode 2. In the first embodiment, a $CF_4$ gas is used as an etching gas. From the above process, the structure shown in FIG. 4C is obtained.

Next, the hydrofluoric acid processing is performed on the microcrystalline semiconductor film 4. In summary, the native oxide film formed on the surface of the microcrystalline semiconductor film 4 is etched away by the hydrofluoric acid. Further, as the microcrystalline semiconductor film 4 is contaminated by boron or the like that is in the air atmosphere, the surface of the microcrystalline semiconductor film 4 is cleaned by this processing. Then, the amorphous semiconductor film 5 and the n-type amorphous semiconductor film 6 are successively formed by the CVD method. In the first embodiment, an amorphous silicon (a-Si) film is used as the amorphous semiconductor film 5. Further, an n-type amorphous silicon (n-a-Si) film obtained by doping a small amount of phosphorus (P) or the like into a-Si is used as the n-type amorphous semiconductor film 6. Then, the a-Si film is formed to have a film thickness of 100 to 200 nm, and the n-a-Si film is formed to have a film thickness of 30 to 80 nm.

Next, the amorphous semiconductor film 5 and the n-type amorphous semiconductor film 6 are patterned into a desired shape with the known photolithography and the dry etching. Then, the resist is removed. In the first embodiment, a $CF_4$ gas is used as the etching gas. As such, the amorphous semiconductor film 5 and the n-type amorphous semiconductor film 6 are processed to have an island shape. Further, the pattern ends of the amorphous semiconductor film 5 and the n-type amorphous semiconductor film 6 are processed to be outside the pattern ends of the microcrystalline semiconductor film 4. More specifically, the amorphous semiconductor film 5 and the n-type amorphous semiconductor film 6 cover the whole part of the microcrystalline semiconductor film 4. In short, the microcrystalline semiconductor film 4 is arranged inside the pattern of the amorphous semiconductor film 5.

The amorphous semiconductor film 5 and the gate insulating film 3 are directly connected near the pattern ends of the amorphous semiconductor film 5. In other words, the amorphous semiconductor film 5 and the lower gate insulating film 3 are connected together near the outside of the outer periphery of the microcrystalline semiconductor film 4. In summary, the microcrystalline semiconductor film 4 is held between the gate insulating film 3 and the amorphous semiconductor film 5 that adhere to each other outside the microcrystalline semiconductor film 4. The amorphous semiconductor film 5 and the gate insulating film 3 have excellent adhesion. Thus, according to the structure above, the adhesion of the microcrystalline semiconductor film 4 and the amorphous semiconductor film 5 can be improved, whereby the film floating and the film peeling can be suppressed.

Further, by arranging the microcrystalline semiconductor film 4 inside the pattern of the amorphous semiconductor film 5, the height of the step portion of the amorphous semiconductor film 5 and the n-type amorphous semiconductor film 6 is lowered. In summary, the height from the upper surface of the gate insulating film 3 to the upper surface of the n-type amorphous semiconductor film 6 is lowered in the outer periphery portion of the n-type amorphous semiconductor film 6. Accordingly, the covering property in the step portion of the source electrode 7 and the drain electrode 8 formed thereon is improved, whereby the step cutting of the source electrode 7 and the drain electrode 8 can be suppressed. From the process above, the structure shown in FIG. 4D can be obtained.

Figure 4E:
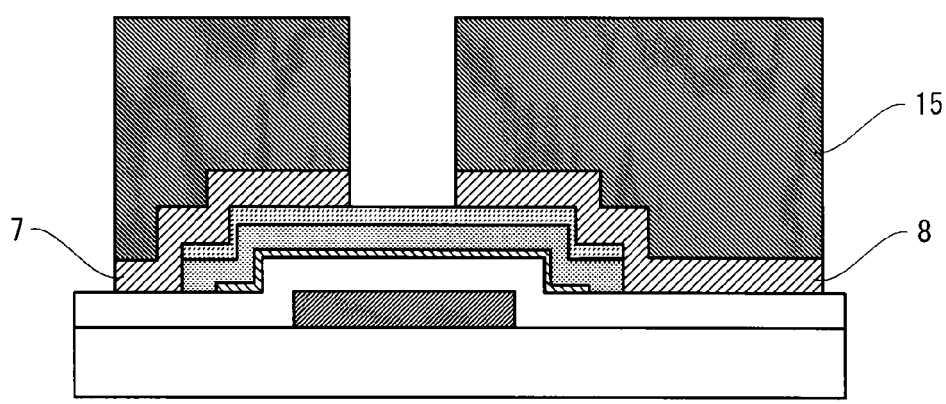

Next, a conductive film to form the source electrode 7 and the drain electrode 8 is formed on the n-type amorphous semiconductor film 6 by the sputtering. An alloy material or a metal material such as Al, Cr, Mo, Ti, W or the like can be used as the conductive film. In the first embodiment, an Mo film is formed as the conductive film. Then, the Mo film is formed to have a film thickness of about 400 nm. Next, the resist 15 is patterned into a desired shape on the conductive film by the known photolithography. Then, the conductive film is etched using the resist 15 as a mask, so as to pattern the conductive film into a desired shape. The source electrode 7 and the drain electrode 8 are thus formed, and the structure shown in FIG. 4E is obtained.

Figure 4F:
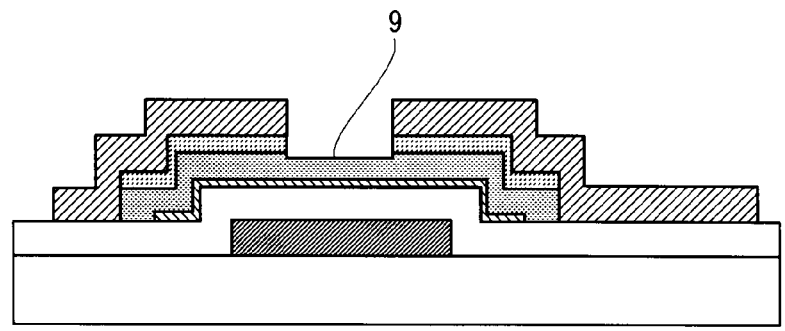

Next, the n-type amorphous semiconductor film 6 and the amorphous semiconductor film 5 are etched by dry etching while leaving the resist 15 on the conductive film. In the first embodiment, the $CF_4$ gas is used as the etching gas. As such, the semiconductor film in a side opposed to the surface to be a channel is etched by dry etching in the semiconductor film including the microcrystalline semiconductor film 4, the amorphous semiconductor film 5, and the n-type amorphous semiconductor film 6. In short, the back channel etch portion 9 is formed by performing back channel etch. More specifically, a part of the n-type amorphous semiconductor film 6 corresponding to the channel region of the TFT is all removed. Further, a part of the amorphous semiconductor film 5 corresponding to the channel region of the TFT is partially removed in a film thickness direction. Then, the resist 15 is removed. According to the process above, the structure shown in FIG. 4F is obtained.

Figure 4G:
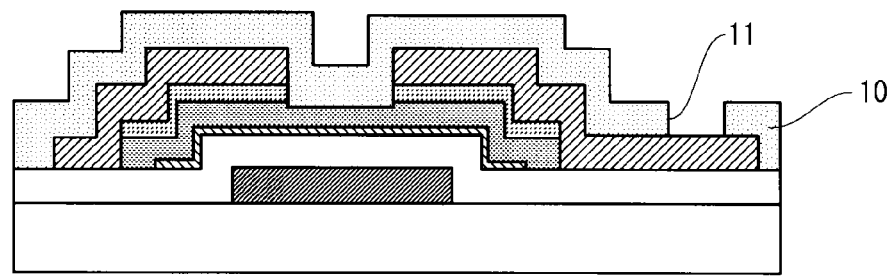

Then, the protective film 10 is formed to cover the source electrode 7 and the drain electrode 8 by the CVD method. In the first embodiment, an SiN film is used as the protective film 10. Then, the SiN film is formed to have a film thickness of about 200 to 400 nm. Then, the protective film 10 is patterned into a desired shape with the known photolithography and dry etching. Then, the resist is removed. In the first embodiment, a mixed gas of $CF_4$ and $O_2$ is used as an etching gas. Thus, the protective film 10 on the drain electrode 8 is removed to open the contact hole 11. In summary, the drain electrode 8 is exposed in the contact hole 11. The structure shown in FIG. 4G is obtained by the process above.

Figure 4H:
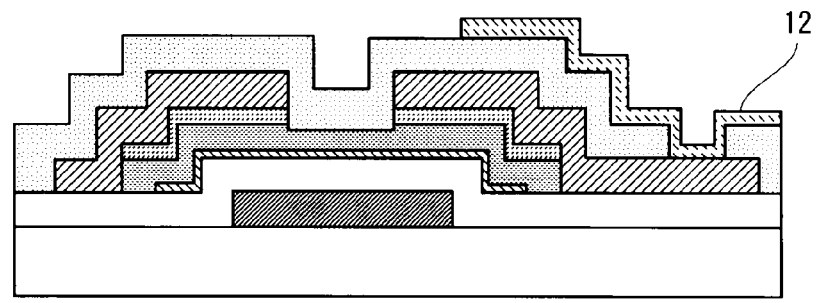

Next, a conductive film to form the pixel electrode 12 is formed on the protective film 10 by the sputtering. A conductive film having transparency such as ITO or IZO can be used as the conductive film. In the first embodiment, ITO is used as the conductive film. Then, the conductive film is patterned into a desired shape by the known photolithography and the etching. Then, the resist is removed. The pixel electrode 12 is thus formed. The pixel electrode 12 is patterned to be connected to the drain electrode 8 through the contact hole 11. Then, the semiconductor device having a microcrystalline silicon TFT structure is completed, as shown in FIG. 4H.

As described above, the microcrystalline semiconductor film 4 is formed inside the pattern of the amorphous semiconductor film 5. Then, the amorphous semiconductor film 5 adheres to the lower gate insulating film 3 near the outside of the outer periphery of the microcrystalline semiconductor film 4. As the amorphous semiconductor film 5 and the lower gate insulating film 3 have excellent adhesion, the adhesion of the microcrystalline semiconductor film 4 with the amorphous semiconductor film 5 is improved, whereby the film floating and the film peeling can be suppressed.

Further, by arranging the microcrystalline semiconductor film 4 inside the pattern of the amorphous semiconductor film 5, the height of the step portion of the amorphous semiconductor film 5 and the n-type amorphous semiconductor film 6 is lowered. Thus, the covering property at the step portion of the source electrode 7 and the drain electrode 8 is improved, whereby step cutting of the source electrode 7 and the drain electrode 8 can be suppressed. Accordingly, the semiconductor device having TFT characteristics with high reliability and excellent initial characteristics can be obtained. Further, as the film peeling or the like hardly occurs, the characteristic variations hardly occurs as well. From the above description, in the manufacturing method of the semiconductor device according to the first embodiment, the improvement of the yield rate and the production efficiency can be realized. Then, the semiconductor device using the microcrystalline silicon TFT can be stably obtained.

Second Embodiment

Figure 5:
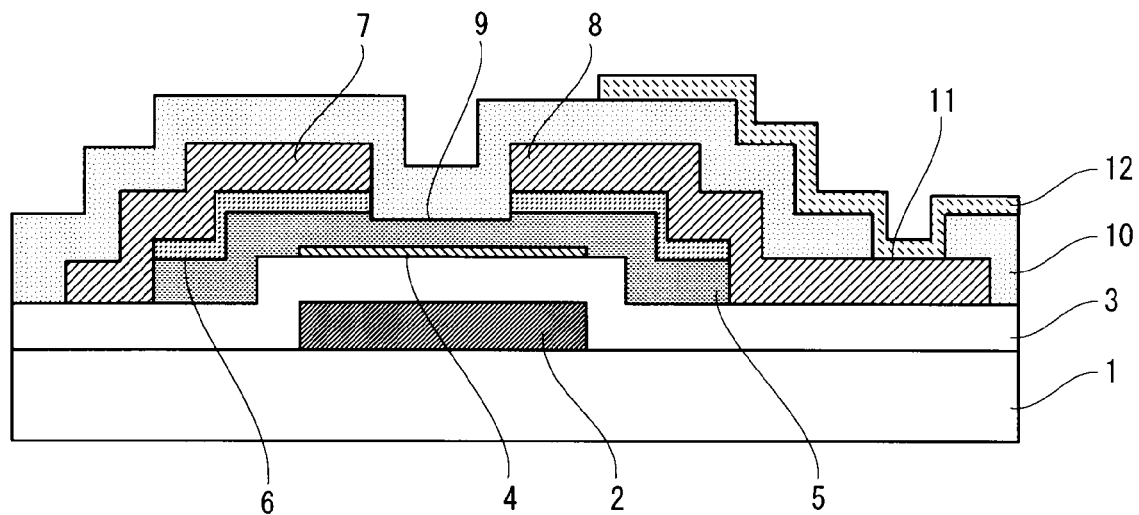
FIG. 5 is a cross sectional view showing the structure of a semiconductor device according to a second embodiment.

In the second embodiment, the microcrystalline semiconductor film 4 is formed only above the gate electrode 2. The other structure, manufacturing method and the like are similar to those of the first embodiment, and thus, description will be omitted. Now, the structure of the semiconductor device according to the second embodiment will be described with reference to FIG. 5. FIG. 5 is a cross sectional view showing the structure of the semiconductor device.

The microcrystalline semiconductor film 4 is formed on the gate insulating film 3. The microcrystalline semiconductor film 4 and the gate electrode 2 are oppositely arranged with the gate insulating film 3 interposed therebetween. Further, the microcrystalline semiconductor film 4 is formed only above the gate electrode 2. In summary, the width of the microcrystalline semiconductor film 4 is substantially similar to the width of the gate electrode 2. Further, the microcrystalline semiconductor film 4 is not formed on the step portion of the gate insulating film 3. Then, the amorphous semiconductor film 5 is formed on the microcrystalline semiconductor film 4. Further, the amorphous semiconductor film 5 is formed to have substantially the same size as that in the first embodiment. In summary, the size is decreased only in the microcrystalline semiconductor film 4 that is held between the amorphous semiconductor film 5 and the gate insulating film 3. As such, the area where the amorphous semiconductor film 5 and the lower gate insulating film 3 contact with each other is larger than that in the first embodiment.

In the second embodiment as well, the same effect as in the first embodiment can be attained. Further, as the area where the amorphous semiconductor film 5 contacts with the lower gate insulating film 3 is larger than that in the first embodiment, the adhesion can further be improved. Note that the semiconductor device according to the second embodiment is manufactured by patterning the resist to have a different shape from that in the first embodiment in the process shown in FIG. 4C.

Third Embodiment

Figure 6:
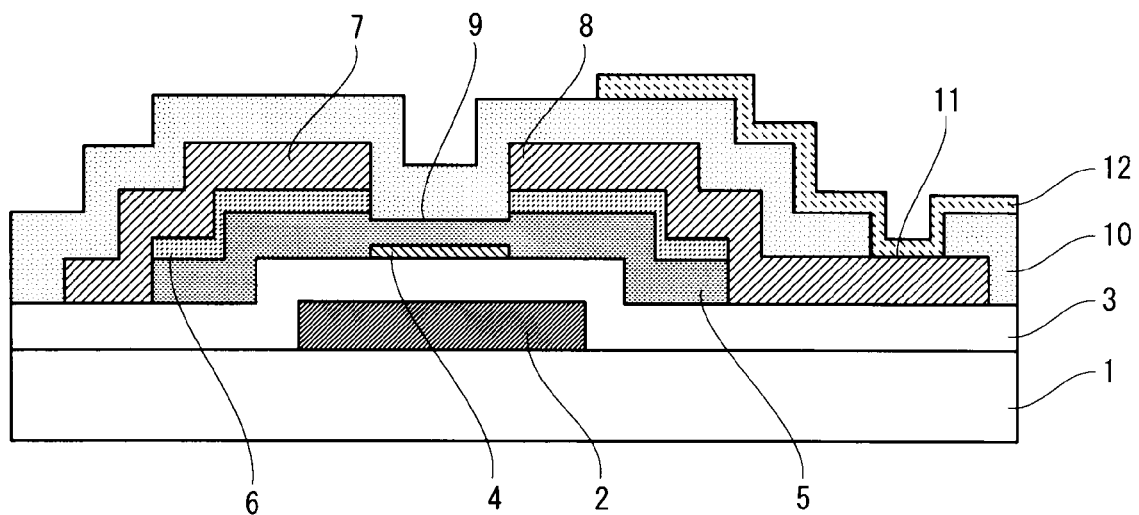
FIG. 6 is a cross sectional view showing the structure of a semiconductor device according to a third embodiment.
Figure 7:
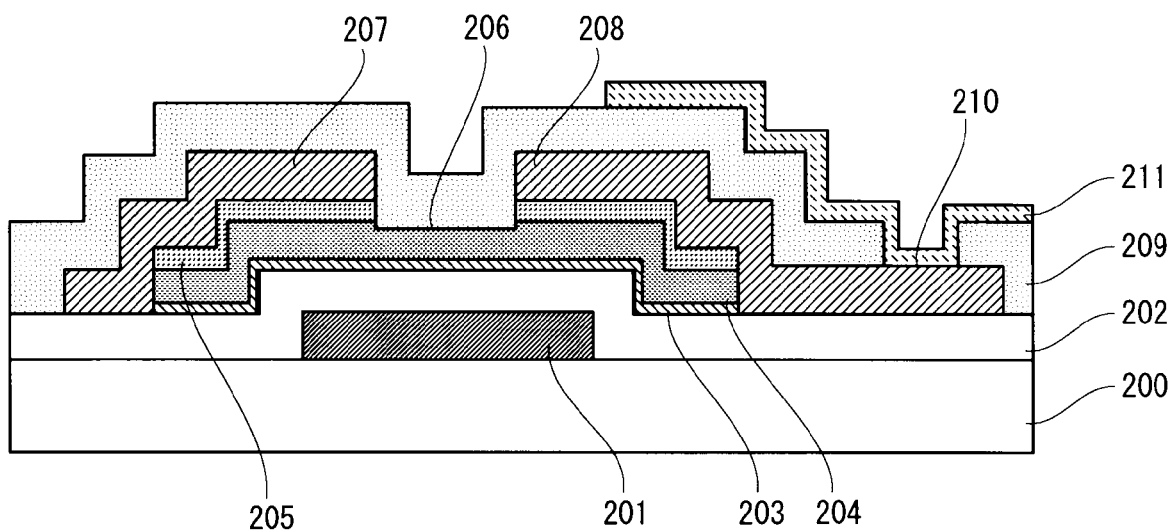
FIG. 7 is a cross sectional view showing the structure of a semiconductor device according to a related art.

In the third embodiment, the microcrystalline semiconductor film 4 is formed only in the channel region. The other structure, manufacturing method and the like are similar to those in the first embodiment, and thus, description will be omitted. Now, the structure of the semiconductor device according to the third embodiment will be described with reference to FIG. 6. FIG. 6 is a cross sectional view showing the structure of the semiconductor device.

The microcrystalline semiconductor film 4 is formed only in the channel region. In other words, the microcrystalline semiconductor film 4 is formed between the source region and the drain region. In other words, the microcrystalline semiconductor film 4 is formed between the source electrode 7 and the drain electrode 8. In other words, the source electrode 7 and the microcrystalline semiconductor film 4, and the drain electrode 8 and the microcrystalline semiconductor film 4 do not overlap. The microcrystalline semiconductor film 4 is formed inside the pattern of the gate electrode 2. Further, the microcrystalline semiconductor film 4 is not formed on the step portion of the gate insulating film 3. Then, the amorphous semiconductor film 5 is formed on the microcrystalline semiconductor film 4. Further, the pattern of the amorphous semiconductor film 5 is formed to have substantially the same size as that in the first embodiment. In summary, the size is decreased only in the microcrystalline semiconductor film 4 that is held between the amorphous semiconductor film 5 and the gate insulating film 3. Further, the microcrystalline semiconductor film 4 according to the third embodiment is formed to be smaller than the microcrystalline semiconductor film 4 in the second embodiment. As such, the area where the amorphous semiconductor film 5 contacts with the lower gate insulating film 3 becomes larger than that of the first and second embodiments.

Also in the third embodiment, the similar effect as that of the first embodiment can be attained. Further, as the area where the amorphous semiconductor film 5 contacts with the lower gate insulating film 3 is larger than that of the first and second embodiments, the adhesion can further be improved. Note that the semiconductor device according to the third embodiment is manufactured by patterning the resist to have a shape different from that in the first embodiment in the process shown in FIG. 4C.

As described above, the microcrystalline semiconductor film 4 may have any shape and size as long as it is formed inside the pattern of the amorphous semiconductor film 5 and it is formed at least in the channel region. Further, although the microcrystalline semiconductor film 4 is preferably formed inside the pattern of the amorphous semiconductor film 5, the pattern of a part of the microcrystalline semiconductor film 4 may be formed to match the pattern of the amorphous semiconductor film 5, for example. Further, a part of the microcrystalline semiconductor film 4 may be formed to protrude from the pattern of the amorphous semiconductor film 5. Needless to say, it is preferable to form it without impairing the initial characteristics by the film peeling or the like.

From the invention thus described, it will be obvious that the embodiments of the invention may be varied in many ways. Such variations are not to be regarded as a departure from the spirit and scope of the invention, and all such modifications as would be obvious to one skilled in the art are intended for inclusion within the scope of the following claims.

What is claimed is:
1. A semiconductor device, comprising:
a gate electrode,
an insulating film that is formed above the gate electrode;
a crystalline semiconductor film that is formed above the insulating film; and
an amorphous semiconductor film formed above the crystalline semiconductor film so that pattern ends of the amorphous semiconductor film are arranged outside pattern ends of the crystalline semiconductor film and the amorphous semiconductor film contacts with the insulating film near the pattern ends.

2. The semiconductor device according to claim 1, wherein the crystalline semiconductor film is only formed above the gate electrode.

3. The semiconductor device according to claim 1, wherein the crystalline semiconductor film is only formed in a channel region.

* * * * *